United States Patent [19]
Majumdar et al.

[11] Patent Number: 5,623,152
[45] Date of Patent: Apr. 22, 1997

[54] INSULATED GATE SEMICONDUCTOR DEVICE

[75] Inventors: Gourab Majumdar; Touru Iwagami, both of Tokyo, Japan

[73] Assignee: Mitsubishi Denki Kabushiki Kaisha, Tokyo, Japan

[21] Appl. No.: 561,255

[22] Filed: Nov. 21, 1995

[30] Foreign Application Priority Data

Feb. 9, 1995 [JP] Japan ................................. 7-021577

[51] Int. Cl.$^6$ .......................... H01L 29/76; H01L 29/94
[52] U.S. Cl. .................. 257/330; 257/329; 257/331
[58] Field of Search .................................. 257/330, 329, 257/331

[56] References Cited

FOREIGN PATENT DOCUMENTS 0094891  11/1983  European Pat. Off. .
4113756  10/1992  Germany .
1198076  8/1989   Japan .

OTHER PUBLICATIONS

IBM Technical Disclosure Bulletin, vol. 22, No. 10, pp. 4523–4525, Mar. 1980, P. J. Tsang, "Method of Forming Side–Contact".

*Primary Examiner*—Mahshid D. Saadat
*Assistant Examiner*—Valencia Martin Wallace
*Attorney, Agent, or Firm*—Oblon, Spivak, McClelland, Maier & Neustadt, P.C.

[57] ABSTRACT

An insulated gate semiconductor device includes a gate trench having a gate electrode formed therein on a gate insulating film, and an emitter trench having an emitter electrode formed therein on a silicon oxide layer, to form a capacitance of a capacitor in a main current path by using the silicon oxide layer in the emitter trench, whereby a transient voltage upon switching is decreased and an application system including a snubber circuit is reduced in size.

10 Claims, 9 Drawing Sheets

INSULATED GATE SEMICONDUCTOR DEVICE

BACKGROUND OF THE INVENTION

1. Field of the Invention

The present invention relates to an insulated gate semiconductor device. More particularly, the invention relates to a device structure for decreasing a transient voltage upon switching of a power semiconductor device having an MOS gate and for size reduction of an application system including a snubber circuit.

2. Description of the Background Art

FIG. 14 is a cross-sectional view of a conventional insulated gate semiconductor device. As an example, an insulated gate bipolar transistor (referred to hereinafter as an IGBT) having a trench MOS gate structure will be described herein.

In FIG. 14, the reference numeral 1 designates a $p^+$ collector layer; 2 designates an $n^+$ buffer layer; 3 designates an $n^-$ layer; 4 designates a p base layer; 5 designates an $n^+$ emitter layer; 6 designates a trench; 7 designates a gate insulating film; 8 designates a gate electrode; 9 designates an emitter electrode; 10 designates a collector electrode; and 11 designates a channel region.

The operation of the IGBT is described below.

When a predetermined collector voltage $V_{CE}$ is applied between the emitter electrode 9 and the collector electrode 10 and a predetermined gate voltage $V_{CE}$ is applied between the emitter electrode 9 and the gate electrode 8, that is, the gate is turned on, then the channel region 11 is inverted to the n type to form a channel through which electrons are emitted from the emitter electrode 9 into the $n^-$ layer 3. The emitted electrons cause forward bias between the $p^+$ collector layer 1 and the $n^-$ layer 3, and holes are emitted from the collector electrode 10 via the $p^+$ collector layer 1 and $n^+$ buffer layer 2 into the $n^-$ layer 3. The result is a great amount of reduction in the resistance of the $n^-$ layer 3 due to conductivity modulation, increasing the current capacity of the IGBT. A voltage drop between the collector and emitter of the IGBT at this time is referred to as an on-state voltage ($V_{CE(SAT)}$).

To switch the IGBT from the on position to the off position, the gate voltage $V_{GE}$ having been applied between the emitter electrode 9 and the gate electrode 8 is reduced to zero or reverse-biased that is, the gate is turned off. Then the n-inverted channel region 11 returns to the p type, and the emission of electrons from the emitter electrode 9 stops. Thereafter, the electrons and holes accumulated in the $n^-$ layer 3 either move to the collector electrode 10 and emitter electrode 9, respectively, or recombine together to disappear.

In general, the on-state voltage of the IGBT is primarily determined by the substantial resistance of the $n^-$ layer 3 required to hold the breakdown voltage. One of the factors of the substantial resistance is the ability of an MOSFET in the IGBT to supply electrons. An IGBT including a narrow deep trench in a chip surface and an MOSFET on the side wall of the trench (referred to hereinafter as a trench gate structure IGBT) is constructed such that the electron supply ability of the MOSFET is enhanced by possibly reducing the spacing between unit cells. Thus, this structure is permitted to decrease the on-state voltage while holding the required breakdown voltage.

Japanese Patent Application laid-Open No. 63-224260 (1988) discloses another conventional insulated gate semiconductor device. In the disclosure, a conductive-modulation MOSFET includes vertical source and channel region arranged in parallel, with a linear hole current path formed in a base region to reduce the lateral resistance in the p base layer thereby preventing latch-up.

In the conventional IGBT as above stated the increase in switching rate increases di/dt at turn-off to increase a spike voltage.

FIG. 15 is a graph showing the spike voltage.

In FIG. 15, $V_{CE}$ indicates a power supply voltage, $I_C$ indicates a collector current, and $\Delta V_{CE}$ indicates the spike voltage.

To withstand the spike voltage, there arises a need for the thickness of the $n^-$ layer 3 which is required to hold the breakdown voltage. The increase in spike voltage with the increase in switching rate increases the thickness of the $n^-$ layer 3 and the on-state resistance. The trench structure causes a high current density and a large amount of power losses in the on position. The increase in switching rate increases the spike voltage, thereby increasing power losses at switching.

To prevent such disadvantages resulting from the spike voltage at turn-off, it has been a common practice to connect an external snubber circuit to the IGBT to prevent the spike voltage. However, an inductance of external interconnection lines is present in the external snubber circuit. When di/dt further increases because of the connection of the snubber circuit to the trench structure IGBT, the spike voltage proportional to the inductance of the external interconnection lines increases, and further increase in thickness of the $n^-$ layer 3 of the device is required to withstand the spike voltage.

The applied voltage and current density are high when the snubber circuit is connected to the trench structure IGBT, and a capacitor having a considerable capacitance is required to prevent the development of the spike voltage. If the device of the IGBT is reduced in size and has an increased capacitance, the total system including the snubber circuit is not reduced in size.

A vertical DMOSFET (referred to hereinafter as a VDMOS) as well as the trench structure IGBT requires the connection of the snubber circuit to prevent the breakdown due to the spike voltage. The capacitance of the capacitor of the snubber circuit increases with the increased capacitance of the VDMOS, and the total system including a power module employing the VDMOS and the snubber circuit is not reduced in size.

In a bridge circuit formed by the VDMOS, an unnecessary parasitic transistor operates in some cases to cause arm short-circuit of the bridge circuit, resulting in device breakdown. The increase in switching rate requires a power MOS for the bridge circuit to which an FR (fast recovery) diode is mounted to prevent the arm short-circuit, and the size reduction of the module is not achieved.

SUMMARY OF THE INVENTION

According to a first aspect of the present invention, an insulated gate semiconductor device comprises: a first semiconductor layer of a first conductivity type having first and second major surfaces; a second semiconductor layer of a second conductivity type formed on or selectively formed in the first major surface of the first semiconductor layer; a third semiconductor layer of the first conductivity type selectively formed in a surface of the second semiconductor layer; a recess having an opening in a surface of the third semiconductor layer or in an exposed surface of the second semiconductor layer and extending depth wise from the opening into the first semiconductor layer; a dielectric layer formed in the recess for covering an exposed surface of the first semiconductor layer in the recess; a first main electrode formed in the recess on the dielectric layer for electrically directly connecting the second and third semiconductor layers; a second main electrode formed on the second major surface of the first semiconductor layer; and a control electrode formed on an insulating film formed on the surface of the second semiconductor layer between the first and third semiconductor layers.

According to a second aspect of the present invention, an insulated gate semiconductor device comprises: a first semiconductor layer of a first conductivity type having first and second major surfaces; a second semiconductor layer of a second conductivity type formed on or selectively formed in the first major surface of the first semiconductor layer; a third semiconductor layer of the first conductivity type selectively formed in a surface of the second semiconductor layer; a first recess having an opening in a surface of the third semiconductor layer and extending depth wise from the opening into the first semiconductor layer; an insulating film therebetween on an inner wall of the first recess; a control electrode formed in the first recess in opposed relation to the second semiconductor layer, with the insulating film therebetween; a second recess having an opening in the surface of the third semiconductor layer or in an exposed surface of the second semiconductor layer and extending depthwise from the opening into the first semiconductor layer, the second recess being located in parallel with the first recess; a dielectric layer formed in the second recess for covering an exposed surface of the first semiconductor layer in the second recess: a first main electrode formed in the second recess on the dielectric layer for electrically directly connecting the second and third semiconductor layers; and a second main electrode formed on the second major surface of the first semiconductor layer.

Preferably, according to a third aspect of the present invention, the first and second recesses are arranged in parallel in the form of grooves.

Preferably, according to a fourth aspect of the present invention, the insulated gate semiconductor device of claim 8, further comprises: a fourth semiconductor layer of the second conductivity type formed between the second major surface of the first semiconductor layer and the second main electrode.

Preferably, according to a fifth aspect of the present invention, the insulated gate semiconductor device of claim 9, further comprises: a resistor layer formed between the dielectric layer and the first main electrode.

The insulated gate semiconductor device according to the first aspect of the present invention has the recess in which the first main electrode is formed on the dielectric layer. The use of the dielectric layer in the recess provides a capacitance of a capacitor in the main current path, which functions as a capacitor for a snubber circuit upon switching. The capacitances are distributedly located in the chip to decrease a spike voltage due to the interconnection inductance of the snubber circuit. The snubber circuit for preventing the spike voltage is reduced in size, and the application system including the snubber circuit is accordingly reduced in size.

The insulated gate semiconductor device according to the second aspect of the present invention has the first recess in which the control electrode is formed on the insulating film, and the second recess in which the second main electrode is formed on the dielectric layer. The use of the dielectric layer formed in the second recess provides a capacitance of a capacitor in the main current path, which functions as a capacitor for a snubber circuit upon switching. The capacitances are distributedly located in the chip to effectively decrease a spike voltage due to the interconnection inductance of the snubber circuit at a high switching rate. Further the snubber circuit for preventing the spike voltage is reduced in size, and the system including the snubber circuit is accordingly reduced in size.

The insulated gate semiconductor device according to the third aspect of the present invention provides for an increased channel width of the total device to achieve a large-capacitance device.

The insulated gate semiconductor device according to the fourth aspect of the present invention has the fourth semiconductor layer to allow some of the carriers in the first semiconductor layer to move to the first main electrode through the capacitance of the capacitor including the dielectric layer in the recess or second recess at turn-off. The insulated gate semiconductor device has a function of the capacitor for the snubber circuit, decreasing the spike voltage at turn-off.

The insulated gate semiconductor device according to the fifth aspect of the present invention has the resistor layer between the dielectric layer and the first main electrode. The current flowing through the dielectric layer is restricted at turn-off, and the oscillation due to a CR time constant is prevented. In addition, the dielectric layer may be thin. This effectively decreases the spike voltage at turn-off.

It is therefore an object of the present invention to provide an insulated gate semiconductor device which decreases a transient voltage upon switching and which permits compact construction of the total system including a power module and a snubber circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
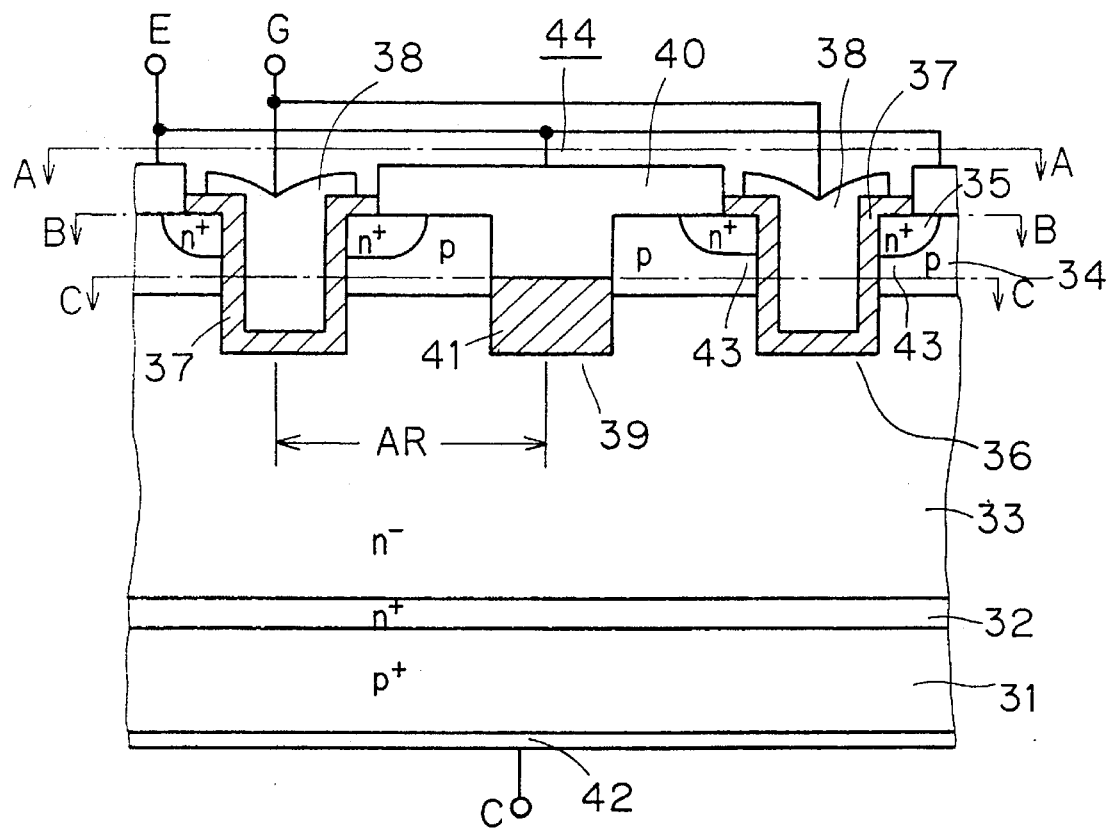
FIG. 1 is a fragmentary cross-sectional view of an insulated gate semiconductor device according to a first preferred embodiment of the present invention.

FIG. 1 is a fragmentary cross-sectional view of an insulated gate semiconductor device according to a first preferred embodiment of the present invention. In the first preferred embodiment, a trench gate structure IGBT is described as an example of the insulated gate semiconductor device.

Figure 2:
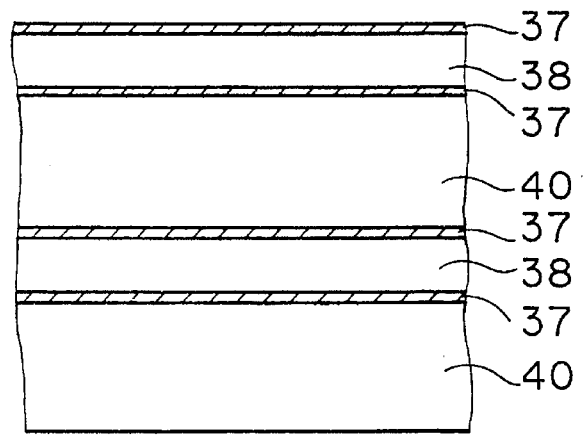
FIG. 2 is a fragmentary plan view of the insulated gate semiconductor device as viewed in the direction of the arrows A—A of FIG. 1.
Figure 3:
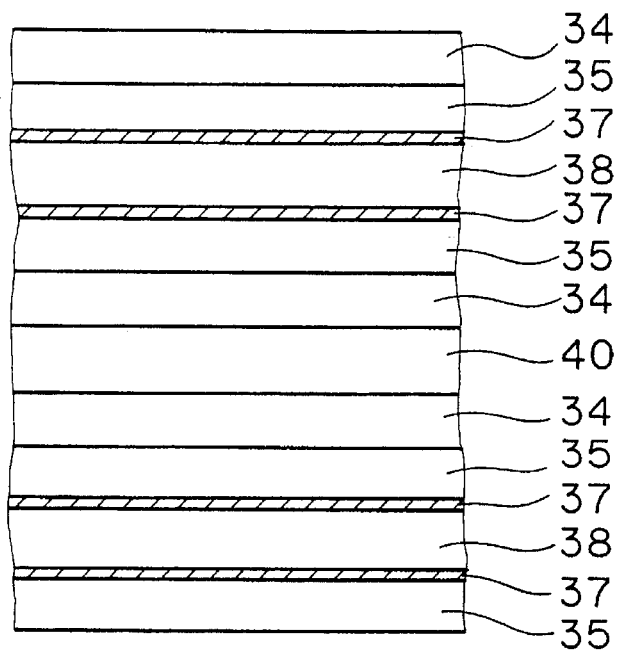
FIG. 3 is a fragmentary plan view of the insulated gate semiconductor device as viewed in the direction of the arrows B—B of FIG. 1.
Figure 4:
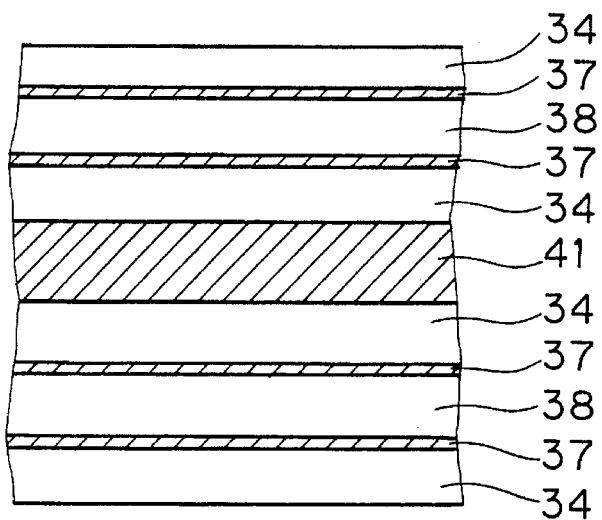
FIG. 4 is a fragmentary plan view of the insulated gate semiconductor device as viewed in the direction of the arrows C—C of FIG. 1.

FIG. 2 is a fragmentary plan view of the trench gate structure IGBT as viewed in the direction of the arrows A—A of FIG. 1. FIG. 3 is a fragmentary plan view of the trench gate structure IGBT as viewed in the direction of the arrows B—B of FIG. 1. FIG. 4 is a fragmentary plan view of the trench gate structure IGBT as viewed in the direction of the arrows C—C of FIG. 1.

In FIGS. 1 to 4, the reference numeral 31 designates a $p^+$ type semiconductor layer serving as a fourth semiconductor layer which is a $p^+$ collector layer in the IGBT; 32 designates an $n^+$ type semiconductor layer serving as an $n^+$ buffer layer; 33 designates an $n^-$ type semiconductor layer which forms a first semiconductor layer with the $n^+$ buffer layer 32; 34 designates a p type semiconductor layer serving as a second semiconductor layer; 35 designates an $n^+$ type semiconductor layer serving as a third semiconductor layer which is an $n^+$ emitter layer in the IGBT; 36 designates a trench for providing a gate electrode therein (referred to hereinafter as a gate trench) and serving as a first recess; 37 designates a gate insulating film serving as an insulating film; 38 designates a gate electrode serving as a control electrode: 39 designates a trench for providing an emitter electrode therein (referred to hereinafter as an emitter trench) and serving as a recess or a second recess; 40 designates an emitter electrode serving as a first main electrode; 41 designates a silicon oxide layer serving as a dielectric layer; 42 designates a collector electrode serving as a second main electrode; and 43 designates a channel region.

The reference character AR with arrows designates the range of a unit cell in FIG. 1.

The respective semiconductor layers are generally constructed as will be described below. A $p^+$ silicon substrate is provided to form the $p^+$ collector layer 31. Formed on the $p^+$ silicon substrate are the $n^+$ buffer layer 32 and $n^-$ type semiconductor layer 33 in sequential order by silicon epitaxial growth.

The p type semiconductor layer 34 is formed by silicon epitaxial growth on the surface of the $n^-$ type semiconductor layer 33 or by diffusion of a dopant in the surface of the $n^-$ type semiconductor layer 33.

The $n^+$ emitter layers 35 are formed in the surface of the p type semiconductor layer 34 into the shape of islands having a periphery of a predetermined configuration by the diffusion of a dopant. In the first preferred embodiment, the $n^+$ emitter layers 35 are arranged to form a plurality of islands extending in parallel.

The gate trench 36 has an opening in the surface of one of the $n^+$ emitter layers 35 and extends depthwise through the $n^+$ emitter layer 35 and the underlying p type semiconductor layer 34 into the $n^-$ type semiconductor layer 33. The gate trench 36 extends in plan view along the $n^+$ emitter layers 35.

Formed on the inner wall of the gate trench 36 is a silicon oxide film serving as the gate insulating film 37 for isolating the gate electrode 38 from the $n^-$ type semiconductor layer 33 and $n^+$ emitter layers 35. The gate trench 36 is filled with polysilicon serving as the gate electrode 38, with the gate insulating film 37 therebetween.

The emitter trench 39 is formed in an exposed surface of the p type semiconductor layer 34 between adjacent $n^+$ emitter layers 35 extending in parallel. The emitter trench 39 has an opening in the exposed surface of the p type semiconductor layer 34 and extends depthwise through the p type semiconductor layer 34 into the $n^-$ semiconductor layer 33. The emitter trench 39 extends in plan view in parallel with the gate trench 36.

The sidewall and bottom surface of the emitter trench 39 which expose at least the $n^-$ type semiconductor layer 33 are covered with the silicon oxide layer 41. The emitter electrode 40 made of an aluminum alloy (for example, aludur) fills the emitter trench 39 on the silicon oxide layer 41. The silicon oxide layer 41, and the emitter electrode 40 and $n^-$ type semiconductor layer 33 on opposite sides of the silicon oxide layer 41 form a capacitor 44. The thickness of the silicon oxide layer 41 ranges from 0.1 to 20 μm and is set to a predetermined thickness corresponding to the required capacitance of the capacitor.

The emitter electrode 40 establishes an electrical direct connection between the p type semiconductor layer 34 and the $n^+$ emitter layer 35 through the peripheral surface of the p type semiconductor layer 34.

Operation will be discussed below.

When a predetermined gate voltage $V_{GE}$ is applied between the emitter electrode 40 and the gate electrode 38, with a predetermined collector voltage $V_{CE}$ applied between the emitter electrode 40 and the collector electrode 42, to turn on the gate, then the channel region 43 in the p type semiconductor layer 34 is inverted to the n type to form a channel through which electrons are emitted from the emitter electrode 40 into the $n^-$ type semiconductor layer 33. The emitted electrons cause forward bias between the $p^+$ collector layer 31 and the $n^-$ type semiconductor layer 33, and holes are emitted from the collector electrode 42 via the $n^+$ buffer layer 32 into the $n^-$ type semiconductor layer 33. The result is a great amount of reduction in the resistance of the $n^-$ type semiconductor layer 33 due to conductivity modulation, increasing the current capacity of the IGBT. A voltage drop between the collector and emitter of the IGBT at this time is referred to as an on-state voltage ($V_{CE(SAT)}$).

To switch the IGBT from the on position to the off position, the gate voltage $V_{GE}$ having been applied between the emitter electrode 4 and the gate electrode 38 is reduced to zero or reverse-biased to turn off the gate. Then the n-inverted channel region 43 returns to the p type, and the emission of electrons from the emitter electrode 40 stops. Thereafter, the electrons and holes accumulated in the n⁻ type semiconductor layer 33 either move to the collector electrode 42 and emitter electrode 40, respectively, or recombine together to disappear.

When the gate is turned off, the holes accumulated and remaining in the n⁻ type semiconductor layer 33 as a result of the increase in current capacity due to the conductivity modulation at turn-on of the gate are attracted to the emitter electrode 40 as the voltage increases between the collector electrode 42 and the emitter electrode 40. There are two paths of movement of the holes: a first path from the junction of the n⁻ type semiconductor layer 33 and p type semiconductor layer 34 through the p type semiconductor layer 34 to the emitter electrode 40, and a second path via the capacitor 44 comprised of the silicon oxide layer 41, emitter electrode 40 and n⁻ type semiconductor layer 33 to the emitter electrode 40.

The capacitors 44 in the second path function as a capacitance for the snubber circuit. The capacitors 44 are distributedly located in a lower layer of the emitter electrodes 40 to readily form a large capacitance as a capacitance of the capacitor for the snubber circuit and to eliminate the need for or significantly reduce the circuit interconnection lines required for the external snubber circuit.

In particular, the trench gate structure IGBT can achieve high-speed switching because of the facts that no voltage drop based on the JFET effect as compared with the conventional planar gate structure IGBT decreases the on-state voltage $V_{CE(SAT)}$) at turn-on to increase the current density and that the trench gate structure IGBT provides smaller-sized cells and, accordingly, a greater number of cells than the planar gate structure IGBT to provide a wider contact area between the emitter electrode 40 and the p type semiconductor layer 34 and a wider path of the hole movement at turn-off. As a result, the trench gate structure IGBT has a greater value of di/dt than the planar gate structure IGBT, which might cause the inductance of the circuit interconnection lines to prevent the absorption of the spike voltage in the presence of the external snubber circuit.

In the first preferred embodiment, however, no or greatly reduced circuit interconnection lines significantly decrease the circuit inductance of the snubber circuit. This allows the capacitors 44 distributedly located in the lower layer of the emitter electrodes 40 to readily absorb the spike voltage due to the increase in di/dt by the trench gate structure IGBT.

Further the trench gate structure IGBT having a high current density and an increased spike voltage due to the increased value of di/dt accordingly increases the capacitance of the capacitor for the snubber circuit for absorbing the spike voltage and the size and configuration of the snubber circuit. In this manner, the application system including the snubber circuit has not been reduced in size although the size reduction of the power device has been achieved. In the first preferred embodiment, however, the thin dielectric layer is buried in the emitter trench 39 to increase the capacitance per unit area. The capacitors 44 distributedly located in the emitter trenches 39 are formed in the main current path. This provides for a small-sized large-capacitance capacitor to accomplish the size reduction of the system including the snubber circuit.

Figure 5:
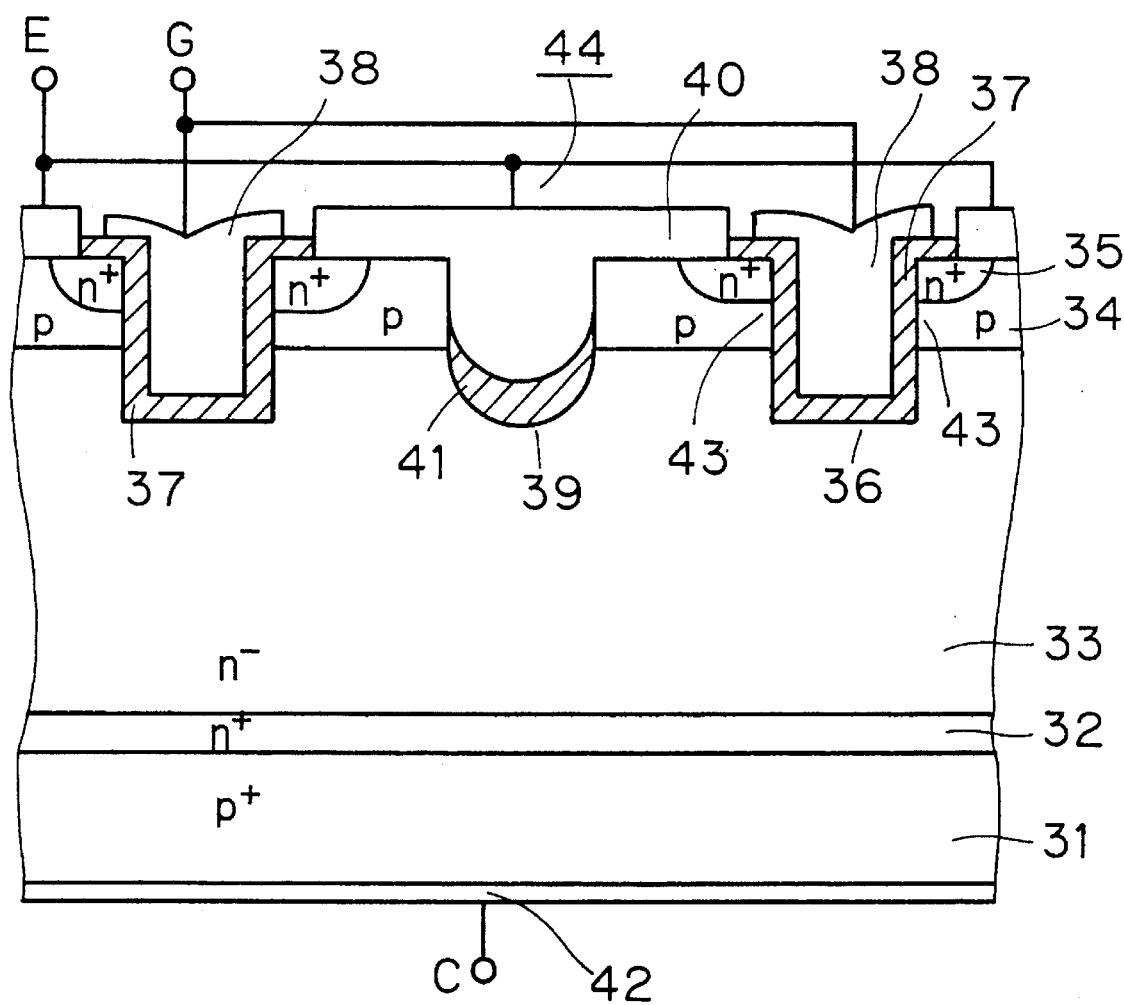
FIGS. 5 and 6 illustrate modifications of the insulated gate semiconductor device of FIG. 1.

FIG. 5 illustrates a modification of the first preferred embodiment of FIG. 1.

Referring to FIG. 5, the silicon oxide layer 41 has a smoothly curved bottom surface. Such a configuration of the bottom surface facilitates the formation of the silicon oxide layer 41.

Figure 6:
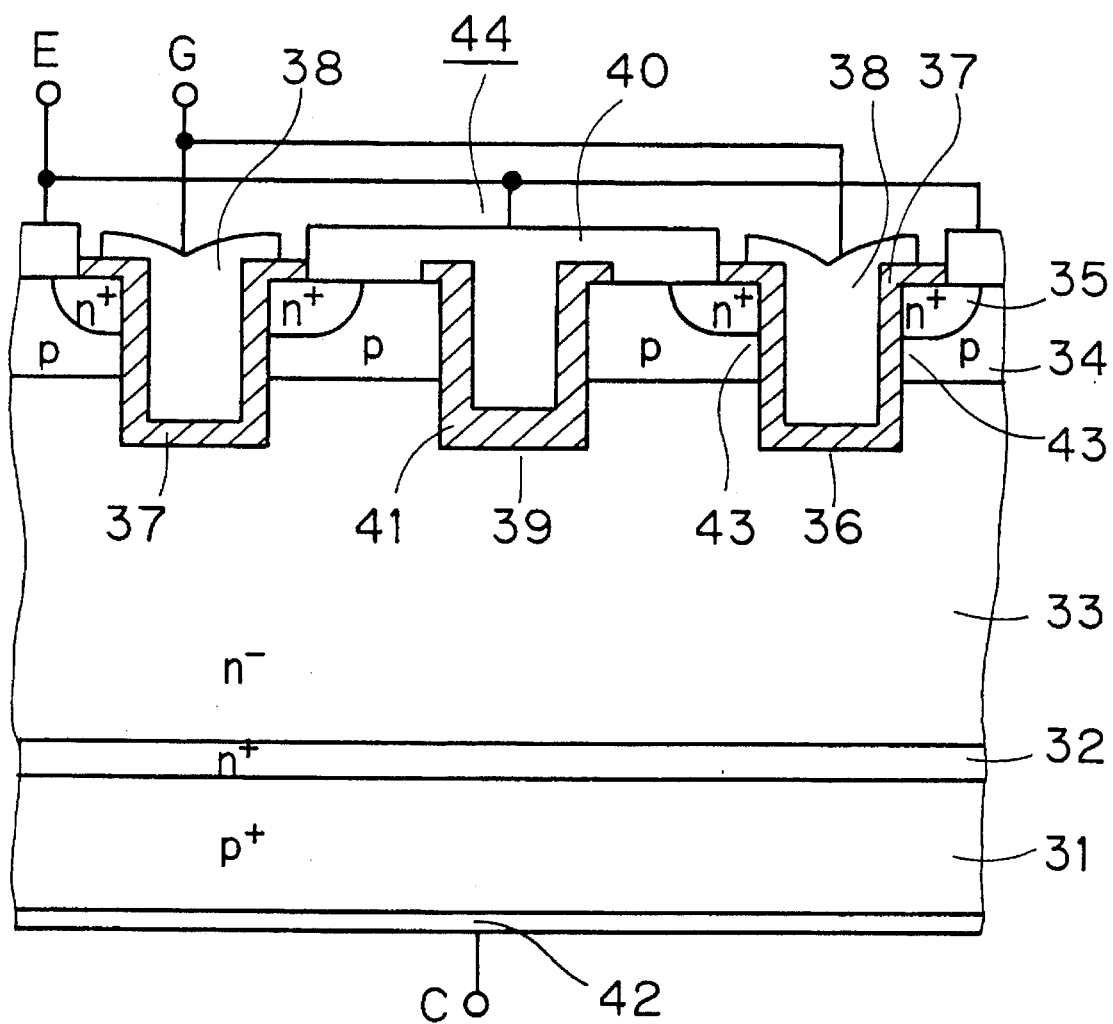

FIG. 6 illustrates another modification of the first preferred embodiment of FIG. 1.

Referring to FIG. 6, the silicon oxide layer 41 is buried in the emitter trench 39 such that the bottom of the emitter trench 39 and the side wall thereof extending from the bottom to the opening are covered with the silicon oxide layer 41. The silicon oxide layer 41 is formed in the shape of a thin film, and the emitter electrode 40 is buried deep in the emitter trench 39 in opposed relation to the n⁻ type semiconductor layer 33, with the silicon oxide layer 41 on the side wall of the emitter trench 39 therebetween. Other constructions of the modification of FIG. 6 are identical with those of the first preferred embodiment.

The silicon oxide layer 41 formed in this manner provides an equivalent capacitance of the capacitor 44 to the capacitance of the first preferred embodiment since an electrical connection is directly made between the p type semiconductor layer 34 and the emitter electrode 40. However, the silicon oxide layer 41 of FIG. 6 extending up to the opening of the emitter trench 39 is formed more easily than that of the first preferred embodiment. The thin film-shaped silicon oxide layer 11 can set a large capacitance of the capacitor 44.

Second Preferred Embodiment

Figure 7:
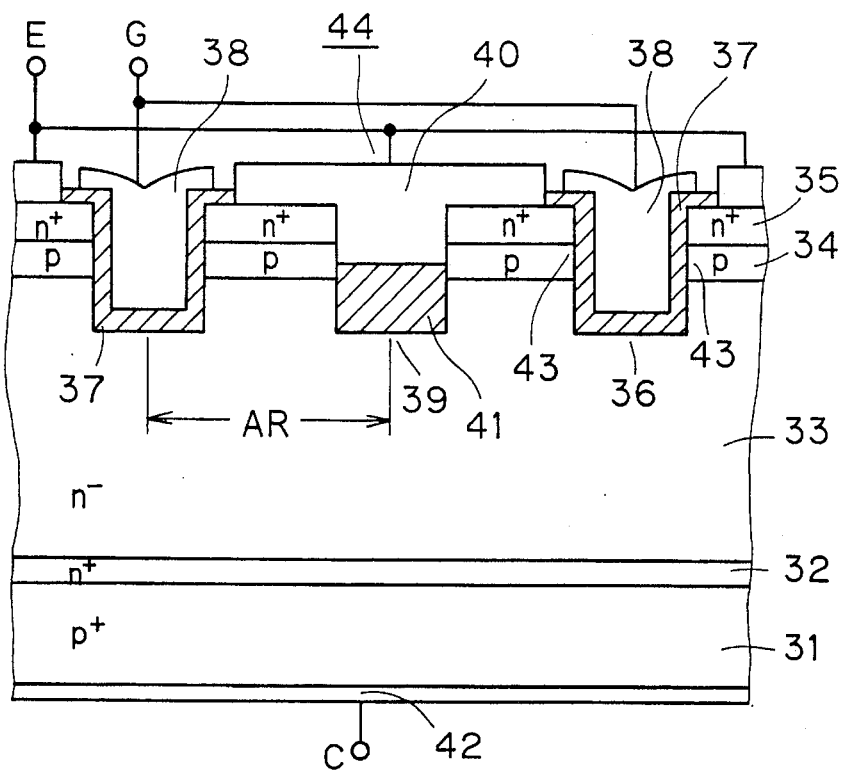
FIG. 7 is a fragmentary cross-sectional view of the insulated gate semiconductor device according to a second preferred embodiment of the present invention.

FIG. 7 is a fragmentary cross-sectional view of the insulated gate semiconductor device according to a second preferred embodiment of the present invention. The trench gate structure IGBT is described in the second preferred embodiment like the first preferred embodiment.

Referring to FIG. 7, the p type semiconductor layer 34 is formed by silicon epitaxial growth on the surface of the n⁻ type semiconductor layer 33 or by diffusion of a dopant in the surface of the n⁻ type semiconductor layer 33. The n⁺ emitter layer 35 which covers the p type semiconductor layer 34 is formed by epitaxial growth or by diffusion of a dopant in the surface of the p type semiconductor layer 34.

The emitter trench 39 has an opening in the surface of the n⁺ emitter layer 35 and extends depthwise from the surface of the n⁺ emitter layer 35 through the p type semiconductor layer 34 into the n⁻ type semiconductor layer 33. The sidewall and bottom surface of the emitter trench 39 which expose at least the n⁻ type semiconductor layer 33 are covered with the silicon oxide layer 41, but the sidewall of the emitter trench 39 which exposes the p type semiconductor layer 34 and n⁺emitter layer 35 has a surface which is not covered with the silicon oxide layer 41. The emitter electrode 40 buried in the emitter trench 39 electrically directly connects the p type semiconductor layer 34 and n⁺ emitter layer 35 which are exposed by the sidewall of the emitter trench 39. Other constructions of the second preferred embodiment are identical with those of the first preferred embodiment.

In this manner, the contact between the emitter electrode 40 and the p type semiconductor layer 34 need not be made in the chip surface but may be made within the emitter trench 39. This eliminates the need for the surface area for the contact with the p type semiconctuctor layer 34 and the need for a margin for mask alignment to make the contact, to reduce the range of a unit cell and achieve the high density of the cell, thereby reducing the size of the chip.

Figure 8:
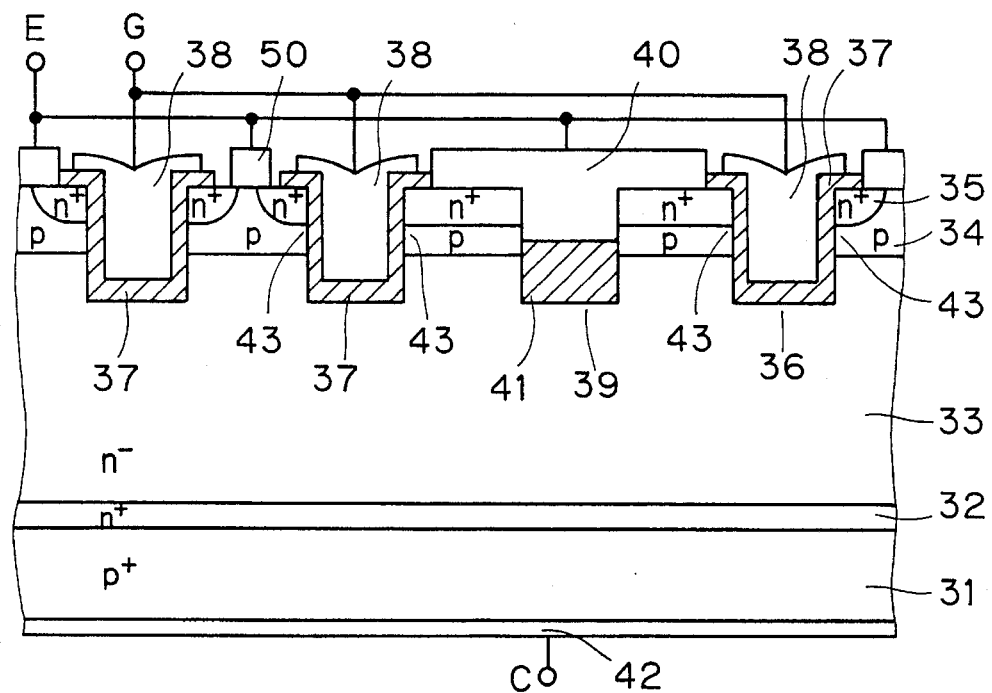
FIG. 8 illustrates a modification of the insulated gate semiconductor device of FIG. 7.

FIG. 8 is a fragmentary cross-sectional view of a modification of the second preferred embodiment of FIG. 7. In this modification, the n⁺ emitter layer 35 does not cover the surface of the p type semiconductor layer 34 but the chip includes both the emitter electrode 40 buried in the emitter trench 39 and an emitter electrode 50 of the conventional construction formed on the chip surface, unlike the second preferred embodiment of FIG. 7. The chip having a small power capacity requires a small amount of capacitance of the capacitor needed for the snubber circuit. The chip including both the emitter electrode 4 and the emitter electrode 50 of the conventional construction is less expensive.

Third Preferred Embodiment

Figure 9:
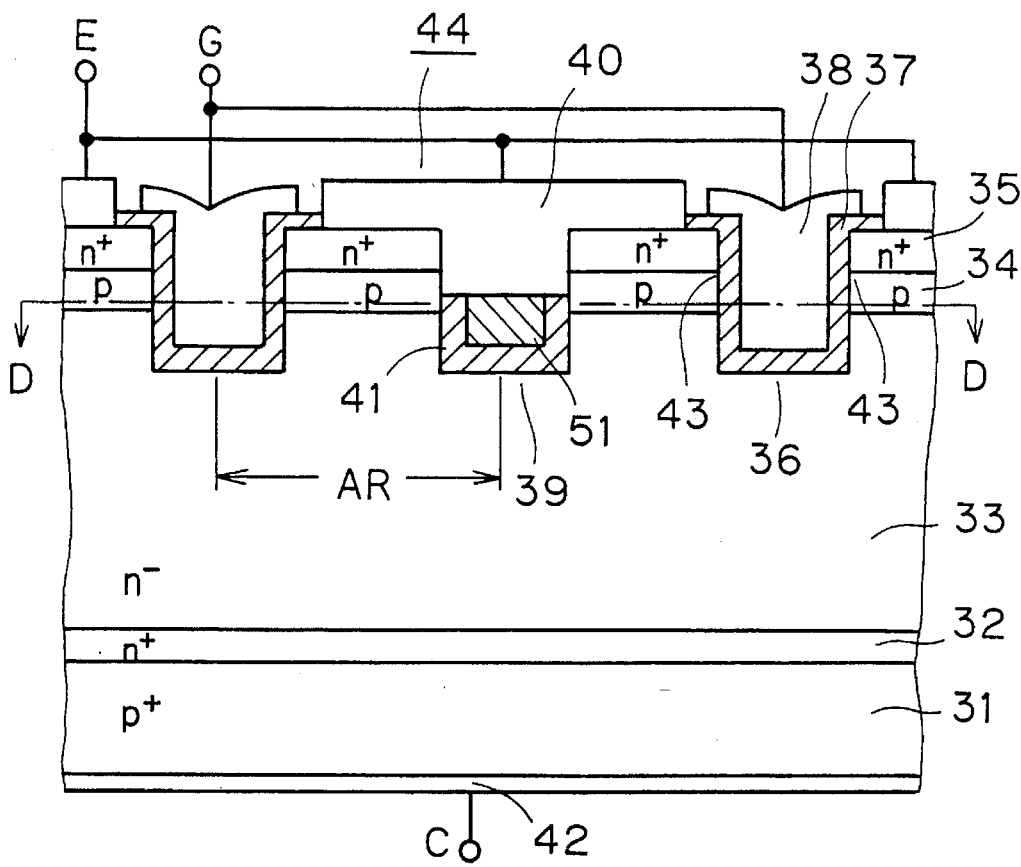
FIG. 9 is a fragmentary cross-sectional view of the insulated gate semiconductor device according to a third preferred embodiment of the present invention.

FIG. 9 is a fragmentary cross-sectional view of the insulated gate semiconductor device according to a third preferred embodiment of the present invention. The trench gate structure IGBT is described in the third preferred embodiment like the first preferred embodiment.

Figure 10:
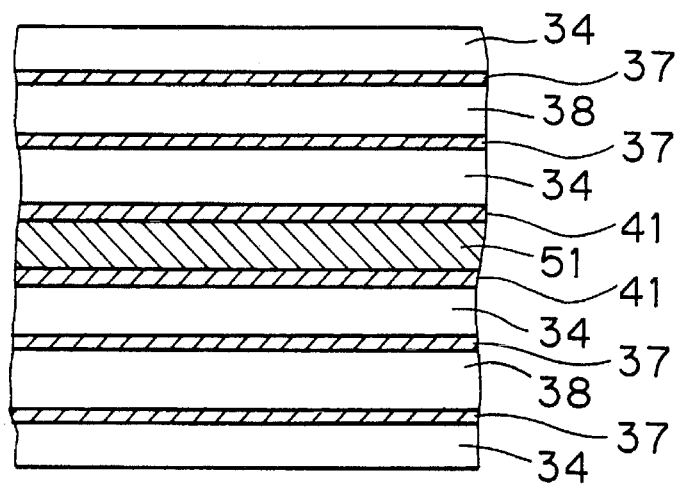
FIG. 10 is a fragmentary plan view of the insulated gate semiconductor device as viewed in the direction of the arrows D—D of FIG. 9.

FIG. 10 is a fragmentary plan view of the IGBT as viewed in the direction of the arrows D—D of FIG. 9.

The third preferred embodiment comprises a resistor layer formed between the silicon oxide layer 41 and the emitter electrode 40 when the emitter electrode 40 is buried in the emitter trench 39.

In FIGS. 9 and 10, the reference numeral 51 designates a polysilicon layer serving as the resistor layer. The emitter trench 39 has an opening in the surface of the $n^+$ emitter layer 35 and extends depthwise from the surface of the $n^+$ emitter layer 35 through the p type semiconductor layer 34 into the $n^-$ type semiconductor layer 33. The sidewall and bottom surface of the emitter trench 39 which expose the $n^-$ type semiconductor layer 33 are covered with the thin-film silicon oxide layer 41.

The polysilicon layer 51 is buried in the emitter trench 39 having an inner wall surface on which the silicon oxide layer 41 is formed. An aluminum alloy (e.g., aludur) is buried in the emitter trench 39 on the silicon oxide layer 41 and polysilicon layer 51 to form the emitter electrode 4. The sidewall and bottom surface of the emitter trench 39 which expose the $n^-$ type semiconductor layer 33 are covered with the silicon oxide layer 41, but the sidewall of the emitter trench 39 which exposes the p type semiconductor layer 34 and $n^+$ emitter layer 35 has a surface which is not covered with the silicon oxide layer 41. The emitter electrode 40 buried in the emitter trench 39 establishes an electrical direct connection between the p type semiconductor layer 34 and the $n^+$ emitter layer 35 on the sidewall of the emitter trench 39. Other constructions of the third preferred embodiment are identical with those of the first preferred embodiment.

In such a structure, the polysilicon layer 51 is formed in one of the paths of movement of the holes accumulated and remaining in the $n^-$ type semiconductor layer 33 to the emitter electrode 40, that is, the path via the capacitor 44 comprised of the silicon oxide layer 41, emitter electrode 40, and $n^-$ type semiconductor layer 33 to the emitter electrode 40. This establishes an in-series connection of the capacitor 44 and the resistor of the polysilicon layer 51 to permit the restriction of the hole current flowing through the path at turn-off of the gate. Suitably setting the thickness of the silicon oxide layer 41 and polysilicon layer 51 can control a CR time constant to effectively prevent oscillation of the spike voltage.

Fourth Preferred Embodiment

Figure 11:
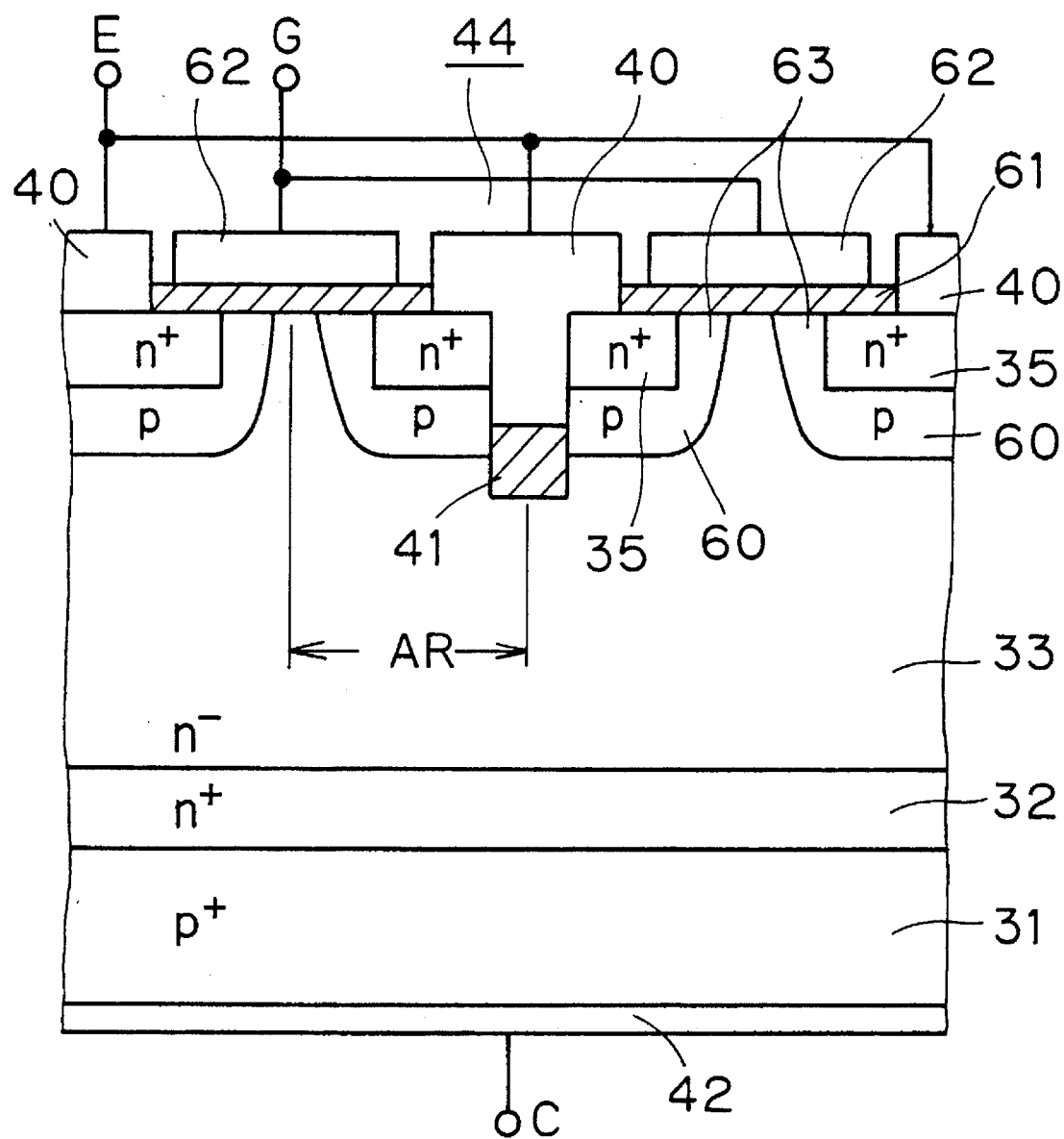
FIG. 11 is a fragmentary cross-sectional view of the insulated gate semiconductor device according to a fourth preferred embodiment of the present invention.

FIG. 11 is a fragmentary cross-sectional view of the insulated gate semiconductor device according to a fourth preferred embodiment of the present invention. The present invention is applied to a conventional planar gate structure IGBT in the fourth preferred embodiment.

In FIG. 11 the reference numeral 6 designates p type semiconductor layers serving as a second semiconductor layer and arranged in the form of islands in the surface of the $n^-$ type semiconductor layer 33; 61 designates a gate insulating film; 62 designates a gate electrode; and 63 designates a channel region. Other constructions of the fourth preferred embodiment are identical with those of the second preferred embodiment.

The fourth preferred embodiment differs in gate structure from the first preferred embodiment but is similar thereto in operation as an IGBT. Thus the silicon oxide layer 41 is formed between the emitter electrode 4 and the $n^-$ type semiconductor layer 33 to form the capacitor 44. The capacitors 44 are distributedly located in the lower layer of the emitter electrodes 40 to eliminate the need for or significantly reduce the circuit interconnection lines required for the external snubber circuit. Therefore, the circuit inductance of the snubber circuit is significantly reduced, and the spike voltage resulting from the increase in di/dt is readily absorbed. This eliminates the need for the large-sized capacitor of the snubber circuit to achieve the size reduction of the entire application system including the snubber circuit.

Fifth Preferred Embodiment

Figure 12:
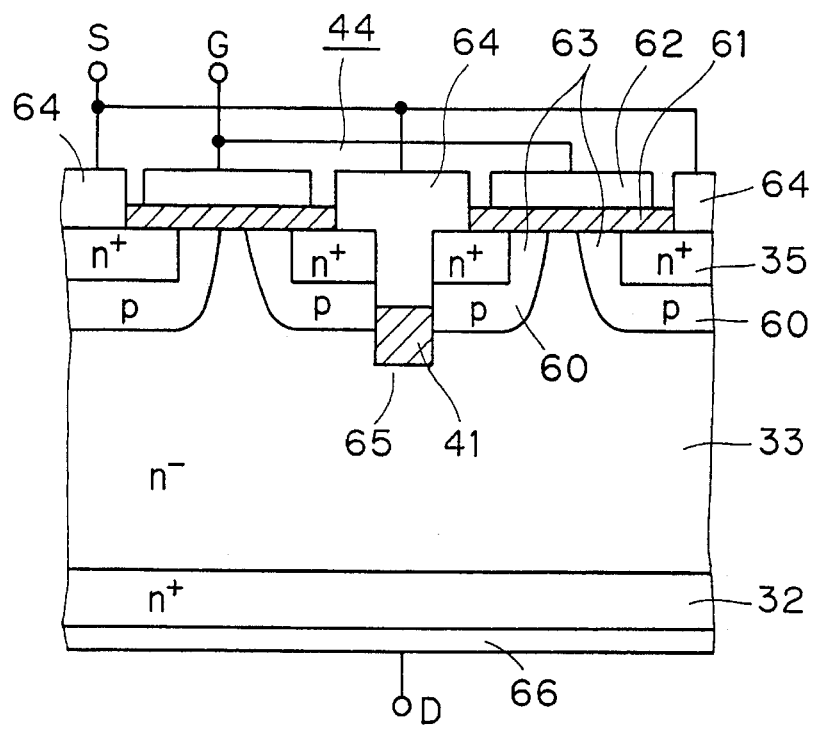
FIG. 12 is a fragmentary cross-sectional view of the insulated gate semiconductor device according to a fifth preferred embodiment of the present invention.

FIG. 12 is a fragmentary cross-sectional view of the insulated gate semiconductor device according to a fifth preferred embodiment of the present invention. The present invention is applied to a VDMOS having a planar gate structure in the fifth preferred embodiment.

In the first to fourth preferred embodiments, the capacitor 44 comprised of the silicon oxide layer 41, emitter electrode 40 and $n^-$ type semiconductor layer 33 is formed as one of the paths along which the holes accumulated in the $n^-$ type semiconductor layer 33 due to the conductivity modulation of the IGBT move to the emitter electrode 40 at turn-off, to act as a capacitor for the snubber circuit for preventing the spike voltage at turn-off. In the fifth preferred embodiment, the capacitor 44 comprised of the silicon oxide layer 41, a source electrode 64 and the $n^-$ type semiconductor layer 33 acts as a capacitor for the snubber circuit for preventing the breakage of the gate insulating film due to the spike voltage of the VDMOS and for preventing a parasitic transistor of the VDMOS from turning on.

In FIG. 12, the reference numeral 32 designates an $n^+$ type semiconductor layer serving as an $n^+$ buffer layer; 33 designates an $n^-$ type semiconductor layer which forms a first semiconductor layer with the $n^+$ buffer layer 32; 60 designates a p type semiconductor layer serving as a second semiconductor layer; 35 designates an $n^+$ type semiconductor layer serving as a third semiconductor layer which is an $n^+$source layer in the fifth preferred embodiment; 61 designates a gate insulating film serving its an insulating film; 62 designates a gate electrode serving as a control electrode; 63 designates a channel region; 65 designates a trench for providing a source electrode therein (referred to hereinafter as a source trench) and serving as a recess; 41 designates a silicon oxide layer serving as a dielectric layer; 64 designates a source electrode serving as a first main electrode; and 66 designates a drain electrode serving as a second main electrode.

The VDMOS of the fifth preferred embodiment comprises the $n^+$ buffer layer 32 formed on a surface of the n type silicon substrate by diffusion of a dopant, and the p type semiconductor layers 6 formed in the opposite surface thereof in the shape of islands by diffusion of a dopant. The n⁺ source layers 35 are formed by diffusion of a dopant in spaced apart relation to the peripheries of the p type semiconductor layers 60. The gate insulating films 61 are formed on the surfaces of the p type semiconductor layers 60 between the exposed surfaces of the n⁺ source layers 35 and n⁻ type semiconductor layer 33, and the gate electrodes 62 are formed on the surface of the gate insulating films 61.

Formed in the surface of the n⁺ source layer 35 is the source trench 65 having an opening in the surface thereof and extending depthwise from the surface of the n⁺ source layer 35 through the n⁺ source layer 35 and the underlying p type semiconductor layer 60 into the n⁻ type semiconductor layer 33. The sidewall and bottom surface of the source trench 65 which expose at least the n⁻ type semiconductor layer 33 are covered with the silicon oxide layer 41, and the source electrode 64 made of, for example, an aluminum alloy is buried in the source trench 65 on the silicon oxide layer 41. The silicon oxide layer 41, and the source electrode 64 and n⁻ type semiconductor layer 33 on opposite sides of the silicon oxide layer 41 form the capacitor 44. The thickness of the silicon oxide layer 41 ranges from 0.1 to 20 μm and is set to a predetermined thickness corresponding to the required capacitance of the capacitor.

The VDMOS is typically used to form a bridge circuit such as an inverter or servo circuit under an inductance load. When the pn junction on the drain side of the VDMOS in the bridge circuit is used for a fly wheel diode, a regenerative current flows through the fly wheel diode at switching, and accumulated charges are stored in the p type semiconductor layer 6 serving as a base of a parasitic npn transistor comprised of the n⁺ source layer 35, p type semiconductor layer 60 and n⁻ type semiconductor layer 33. Then the fly wheel diode recovers, and the junction capacitance of the p type semiconductor layer 6 and n⁻ type semiconductor layer 33 and the value dV/dT at this time increase the drain-source voltage $V_{DS}$ of the VDMOS, to turn on the parasitic npn transistor, resulting in arm short-circuit. To prevent such a defect a product of the VDMOS with an external high-speed diode is normally used.

In the VDMOS of the fifth preferred embodiment, however, the capacitor 44 comprised of the silicon oxide layer 41 and the source electrode 64 and n⁻ type semiconductor layer 33 on opposite sides of the silicon oxide layer 41 is in parallel with the junction capacitance of the p type semiconductor layer 60 and n⁻ type semiconductor layer 33 to reduce the charges through the junction capacitance of the p type semiconductor layer 60 and n⁻ type semiconductor layer 33, preventing the turning on of the parasitic npn transistor and the arm short-circuit.

There is a mode in which a transient voltage having a great rising edge is applied between the drain and source when the VDMOS is turned off. At this time, the junction capacitance of the p type semiconductor layer 6 and n⁻ type semiconductor layer 33 and the value dV/dT increase the gate-source voltage to temporarily turn on the VDMOS, which might cause arm short-circuit.

Therefore the VDMOS of the fifth preferred embodiment in which the capacitor is in parallel with the junction capacitance of the p type semiconductor layer 60 and n⁻ type semiconductor layer 33 reduces the charges through the junction capacitance of the p type semiconductor layer 6 and n⁻ type semiconductor layer 33 to prevent the turning on of the parasitic npn transistor and the arm short-circuit.

The capacitances are distributedly located in the lower layer of the source electrodes 64 and increased, thereby reducing the value dV/dT and the spike voltage.

Therefore, the VDMOS of the fifth preferred embodiment can be formed as a VDMOS for a bridge circuit without a particular external high-speed diode, achieving the size reduction of the module. The VDMOS also requires no external snubber circuit to reduce the size of the application system.

In the fifth preferred embodiment, the sidewall and bottom surface of the source trench 65 which expose the n⁻ type semiconductor layer 33 are covered with the silicon oxide layer 41, but the sidewall of the source trench 65 which exposes the p type semiconductor layer 60 and n⁺ source layers 35 has a surface which is not covered with the silicon oxide layer 41. The source electrode 64 buried in the source trench 65 electrically directly connects the p type semiconductor layer 60 and the n⁺ type semiconductor layer 35 on the sidewall of the source trench 65. Since the contact between the source electrode 64 and the p type semiconductor layer 60 is made within the source trench 65, there is no need to make a contact on the chip surface. This eliminates the need for the surface area for the contact with the p type semiconductor layer 60 and the need for a margin for mask alignment to make the contact, reducing the range of a unit cell and achieving the high density of the cell. Thus, the chip is reduced in size.

Figure 13:
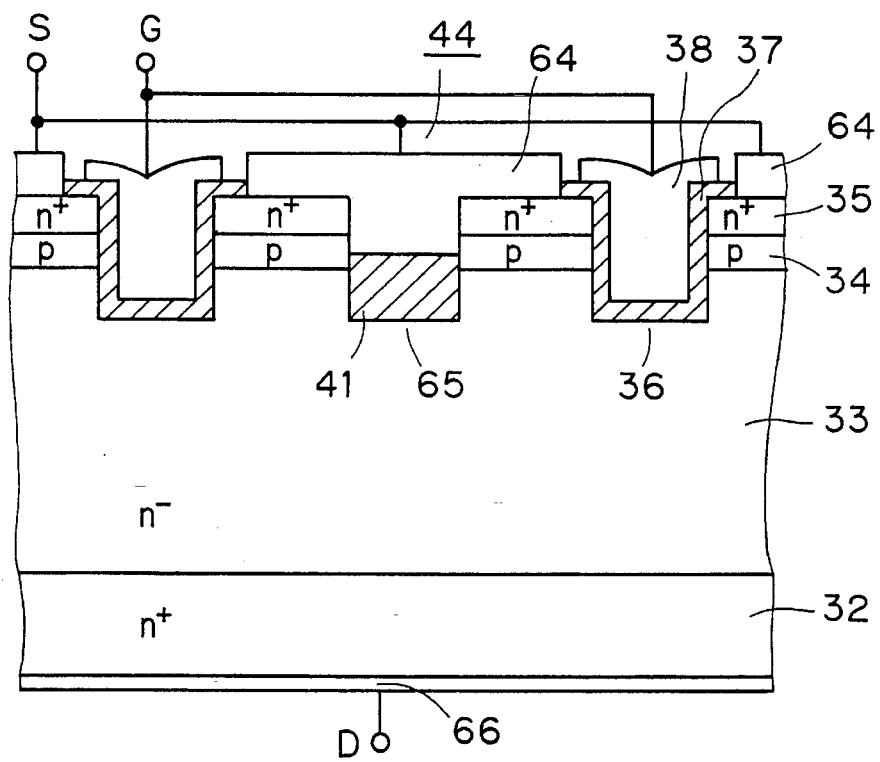
FIG. 13 illustrates a modification of the insulated gate semiconductor device of FIG. 12.
Figure 14:
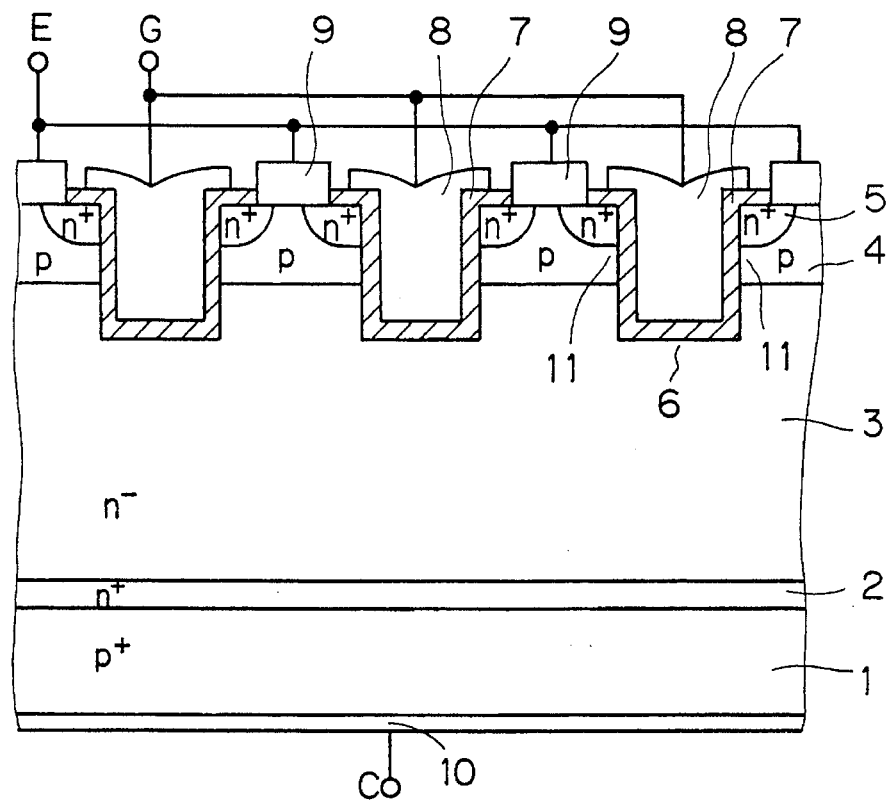
FIG. 14 is a fragmentary cross-sectional view of a conventional insulated gate semiconductor device.
Figure 15:
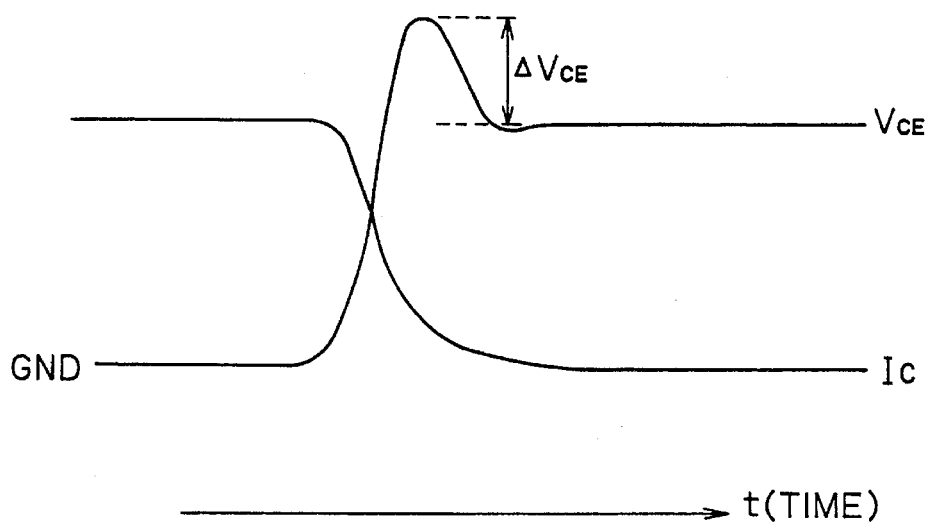
FIG. 15 is a graph showing a spike voltage of the conventional insulated gate semiconductor device.

FIG. 13 is a fragmentary cross-sectional view of a modification of the fifth preferred embodiment. The present invention is applied to a VDMOS having a trench gate structure in this modification.

The VDMOS of FIG. 13 is constructed such that the p⁺ type semiconductor layer 31 is removed from the IGBT of the second preferred embodiment.

The operation of the VDMOS of FIG. 13 is identical with that of the planar gate structure VDMOS of FIG. 12.

Such arrangements eliminate the need to provide a channel region in the chip surface to allow the chip size reduction and high-density unit cell.

Although the present invention has been applied to the n-channel IGBT or MOSFET in the above description, the present invention may be applied to a p-channel IGBT or MOSFET.

While the invention has been described in detail, the foregoing description is in all aspects illustrative and not restrictive. It is understood that numerous other modifications and variations can be devised without departing from the scope of the invention.

We claim:

1. An insulated gate semiconductor device comprising:

a first semiconductor layer of a first conductivity type having first and second major surfaces;

a second semiconductor layer of a second conductivity type formed on or selectively formed in the first major surface of said first semiconductor layer;

a third semiconductor layer of the first conductivity type selectively formed in a surface of said second semiconductor layer;

a recess having an opening in a surface of said third semiconductor layer or in an exposed surface of said second semiconductor layer and extending depthwise from the opening into said first semiconductor layer;

a dielectric layer formed in said recess for covering an exposed surface of said first semiconductor layer in said recess;

a first main electrode formed in said recess on said dielectric layer for electrically directly connecting said second and third semiconductor layers;

a second main electrode formed on the second major surface of said first semiconductor layer; and a control electrode formed on an insulating film formed on the surface of said second semiconductor layer between said first and third semiconductor layers.

2. The insulated gate semi conductor device of claim 1, wherein said first main electrode electrically directly connects said second and third semiconductor layers on an inner wall of said recess.

3. The insulated gate semiconductor device of claim 1, further comprising:

a fourth semiconductor layer of the second conductivity type formed between the second major surface of said first semiconductor layer and said second main electrode.

4. An insulated gate semiconductor device comprising:

a first semiconductor layer of a first conductivity type having first and second major surfaces;

a second semiconductor layer of a second conductivity type formed on or selectively formed in the first major surface of said first semiconductor layer;

a third semiconductor layer of the first conductivity type selectively formed in a surface of said second semiconductor layer;

a first recess having an opening in a surface of said third semiconductor layer and extending depthwise from the opening into said first semiconductor layer;

an insulating film formed on an inner wall of said first recess;

a control electrode formed in said first recess in opposed relation to said second semiconductor layer, with said insulating film therebetween;

a second recess having an opening in the surface of said third semiconductor layer or in an exposed surface of said second semiconductor layer and extending depthwise from the opening into said first semiconductor layer, said second recess being located in parallel with said first recess;

a dielectric layer formed in said second recess for covering an exposed surface of said first semiconductor layer in said second recess;

a first main electrode formed in said second recess on said dielectric layer for electrically directly connecting said second and third semiconductor layers; and a second main electrode formed on the second major surface of said first semiconductor layer.

5. The insulated gate semiconductor device of claim 4, wherein said dielectric layer has a smoothly curved bottom surface.

6. The insulated gate semiconductor device of claim 4, wherein said dielectric layer is formed on an inner wall of said second recess.

7. The insulated gate semiconductor device of claim 4, wherein said first main electrode electrically directly connects said second and third semiconductor layers on the inner wall of said second recess.

8. The insulated gate semiconductor device of claim 4, wherein said first and second recesses are arranged in parallel in the form of grooves.

9. The insulated gate semiconductor device of claim 8, further comprising:

a fourth semiconductor layer of the second conductivity type formed between the second major surface of said first semiconductor layer and said second main electrode.

10. The insulated gate semiconductor device of claim 9, further comprising:

a resistor layer formed between said dielectric layer and said first main electrode.

* * * * *